United States Patent
Cheng et al.

(10) Patent No.: US 8,504,898 B2
(45) Date of Patent: Aug. 6, 2013

(54) STORAGE APPARATUS, CONTROLLER AND DATA ACCESSING METHOD THEREOF

(75) Inventors: Kuo-Yi Cheng, Taipei (TW); Chih-Kang Yeh, Kinmen County (TW)

(73) Assignee: Phison Electronics Corp., Miaoli (TW)

( * ) Notice: Subject to any disclaimer, the term of this patent is extended or adjusted under 35 U.S.C. 154(b) by 1093 days.

(21) Appl. No.: 12/129,320

(22) Filed: May 29, 2008

(65) Prior Publication Data

US 2009/0217136 A1    Aug. 27, 2009

(30) Foreign Application Priority Data

Feb. 21, 2008  (TW) .............................. 97106061 A

(51) Int. Cl.
*G11C 29/00* (2006.01)
(52) U.S. Cl.
USPC .......................................... 714/768; 714/764
(58) Field of Classification Search
USPC .................................................. 714/768, 764
See application file for complete search history.

(56) References Cited

U.S. PATENT DOCUMENTS

| | | | |
|---|---|---|---|
| 6,418,068 B1* | 7/2002 | Raynham | 365/200 |
| 6,683,817 B2* | 1/2004 | Wei et al. | 365/230.03 |
| 7,292,950 B1* | 11/2007 | Resnick | 702/85 |
| 7,529,971 B2* | 5/2009 | Nishimura et al. | 714/6.32 |
| 7,676,640 B2* | 3/2010 | Chow et al. | 711/162 |
| 7,953,931 B2* | 5/2011 | Yu et al. | 711/117 |
| 2002/0097613 A1* | 7/2002 | Raynham | 365/200 |
| 2007/0019811 A1 | 1/2007 | Ishihara et al. | |
| 2007/0226582 A1* | 9/2007 | Tang et al. | 714/758 |
| 2008/0034154 A1* | 2/2008 | Lee et al. | 711/103 |
| 2008/0313389 A1* | 12/2008 | Chow et al. | 711/103 |

FOREIGN PATENT DOCUMENTS

CN  1755819  4/2006

\* cited by examiner

*Primary Examiner* — M. Mujtaba K Chaudry
(74) *Attorney, Agent, or Firm* — J.C. Patents

(57) ABSTRACT

A storage apparatus is provided. The controller of the storage apparatus includes an error correction module and a data disordering module. The error correction module is configured to perform an error correction procedure for a data packet to be written into a flash memory module of the storage apparatus for generating sequence data codes containing the data packet and corresponding error correcting codes, wherein the data packet includes a data area recording data to be written and a spare area recording data related to the data packet. The data disordering module is configured to convert the sequence data codes into non-sequence data codes, wherein the data of the data area and the spare area and error correcting codes are dispersed in the non-sequence data codes. Accordingly, it is possible to effectively increase the safety of the data packet.

12 Claims, 4 Drawing Sheets

STORAGE APPARATUS, CONTROLLER AND DATA ACCESSING METHOD THEREOF

CROSS-REFERENCE TO RELATED APPLICATION

This application claims the priority benefit of Taiwan application serial no. 97106061, filed on Feb. 21, 2008. The entirety of the above-mentioned patent application is hereby incorporated by reference herein and made a part of specification.

BACKGROUND

1. Technology Field

The present invention relates to a storage apparatus. More particularly, the present invention relates to a storage apparatus, in which data may be safely stored in a flash memory, a controller and a data accessing method thereof.

2. Description of Related Art

Digital cameras, cell phone cameras and MP3 are developed quickly recently, and demanding of storage medias thereof is quickly increased accordingly. Since a flash memory has features of non-volatile, power-saving, small size and non-mechanical structure etc., it is suitable for portable applications, and especially for portable battery-powered products. A memory card is a storage apparatus applying a NAND flash memory as the storage media thereof. Since the memory card has a small size and is easy to carry, it is widely applied for storing important personal data. Therefore, the flash memory industry becomes a hot industry within the electronics industry recently.

Conventionally, firmware codes of a storage apparatus may be stored in a programmable read-only memory of a flash memory controller of the storage apparatus, and may be loaded into a static random access memory of the flash memory controller during operation of the storage apparatus. To reduce a size of the storage apparatus, and facilitate renewing/modification of the firmware codes, a technique of directly storing the firmware codes into the flash memory of the storage apparatus, and loading the firmware codes into the flash memory controller during operation of the storage apparatus is developed. However, if data transmitted between the flash memory and the flash memory controller is not encoded, the firmware codes may be easily damaged. Accordingly, a safe data accessing method of the flash memory is required.

SUMMARY

The present invention is directed to a storage apparatus, in which data codes may be safely stored therein.

The present invention is directed to a controller, wherein the controller executes data accessing steps to safely store data codes.

The present invention is directed to a data accessing method, by which data codes may be safely stored.

The present invention provides a storage apparatus including a flash memory module, a controller and a transmission interface. The flash memory module is used for storing data. The controller is coupled to the flash memory module for accessing the flash memory module. The controller includes an error correction module and a data disordering module. The error correction module is configured to perform an error correction encoding for a data packet to be written into the flash memory module to generate sequence data codes containing the data packet and corresponding error correction codes, and perform an error correction for the data packet according to the error correction codes, wherein the data packet includes a data area recording data to be written and a spare area recording data related to the data packet. The data disordering module is configured to convert the sequence data codes into non-sequence data codes, and convert the non-sequence data codes into the sequence data codes, wherein the data of the data area and the spare area and the error correction codes are dispersed in the non-sequence data codes. The transmission interface is coupled to the controller for connecting a host.

In an embodiment of the present invention, the data disordering module includes a data disordering unit and a mapping buffer unit. The data disordering unit is configured to divide the sequence data codes into a plurality of sub sequence data codes and exchange data of at least two bytes within each of the sub sequence data codes for generating the non-sequence data codes containing a plurality of sub non-sequence data codes, and configured to inversely exchange the sub non-sequence data codes for restoring the non-sequence data codes. The mapping buffer unit is configured to transmit the non-sequence data codes to the flash memory in a unit of each sub non-sequence data code, and transmit the non-sequence data codes received from the flash memory module to the data disordering unit in a unit of each sub non-sequence data code.

In an embodiment of the present invention, the data disordering module further includes an encryption/decryption unit, which is used for encrypting and decrypting the sequence data codes.

In an embodiment of the present invention, the error correction module performs the error correction encoding for each byte of the data packet in a non-sequential approach.

In an embodiment of the present invention, the flash memory module is a single level cell NAND flash memory module or a multi level cell NAND flash memory module.

In an embodiment of the present invention, the transmission interface is a PCI express interface, a USB interface, an IEEE1394 interface, a SATA interface, a MS interface, a MMC interface, a SD interface, a CF interface or an IDE interface.

The present invention provides a controller, which is suitable for a storage apparatus having a flash memory module. The controller includes an error correction module and a data disordering module. The error correction module is configured to perform an error correction encoding for a data packet to be written into the flash memory module to generate sequence data codes containing the data packet and corresponding error correction codes, and perform an error correction for the data packet according to the error correction codes, wherein the data packet includes a data area recording data to be written and a spare area recording data related to the data packet. The data disordering module is configured to convert the sequence data codes into non-sequence data codes, and convert the non-sequence data codes into the sequence data codes, wherein the data of the data area and the spare area and the error correction codes are dispersed in the non-sequence data codes.

In an embodiment of the present invention, the data disordering module includes a data disorder unit and a mapping buffer unit. The data disordering unit is configured to divide the sequence data codes into a plurality of sub sequence data codes and exchange data of at least two bytes within each of the sub sequence data codes for generating the non-sequence data codes containing a plurality of sub non-sequence data codes, and configured to inversely exchange the sub non-sequence data codes for restoring the non-sequence data codes. The mapping buffer unit is configured to transmit the non-sequence data codes to the flash memory in a unit of each sub non-sequence data code, and transmit the non-sequence data codes received from the flash memory module to the data disordering unit in a mapping unit of each sub non-sequence data code.

In an embodiment of the present invention, the data disordering module further includes an encryption/decryption unit, which is used for encrypting and decrypting the sequence data codes.

In an embodiment of the present invention, the error correction module performs the error collection encoding for each byte of the data packet in a non-sequential approach.

In an embodiment of the present invention, the flash memory module is a single level cell NAND flash memory module or a multi level cell NAND flash memory module.

In an embodiment of the present invention, the storage apparatus is a flash drive, a flash memory card or a solid-state disk.

The present invention provides a data accessing method, which is suitable for a flash memory module. The data accessing method includes performing an error correction encoding for a data packet to be written into the flash memory module to generate sequence data codes containing the data packet and corresponding error correction codes, wherein the data packet includes a data area recording data to be written and a spare area recording data related to the data packet. The data accessing method further includes converting the sequence data codes into non-sequence data codes, wherein the data of the data area and the spare area and the error correction codes are dispersed in the non-sequence data codes. Moreover, the data accessing method further includes transmitting the non-sequence data codes to the flash memory module.

In an embodiment of the present invention, the data accessing method further includes reading the non-sequence data codes from the flash memory module, so as to convert the non-sequence data codes for restoring the sequence data codes, and performing error correction for the data packet within the sequence data codes according to the error correction codes within the sequence data codes.

In an embodiment of the present invention, the data accessing method further includes encrypting and decrypting the sequence data codes.

In an embodiment of the present invention, the step of converting the sequence data codes into the non-sequence data codes includes dividing the sequence data codes into a plurality of sub sequence data codes, and exchanging data of at least two bytes within each of the sub sequence data codes for generating the non-sequence data codes containing a plurality of sub non-sequence data codes.

In an embodiment of the present invention, the step of transmitting the non-sequence data codes to the flash memory module includes transmitting the non-sequence data codes to the flash memory in a unit of each sub non-sequence data code.

In an embodiment of the present invention, the step of performing the error correction encoding for the data packet includes performing the error correction encoding to each byte of the data packet in a non-sequential approach.

In the present invention, by dispersing the data codes to be transmitted to the flash memory module, the data of the data area, the data of the spare are and the error correction codes within the transmitted data codes then cannot be distinguished. Accordingly, safety of the data codes transmission may be effectively improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Presently, when data is stored into a flash memory, a controller of the flash memory generally performs an error correction encoding to the data to be written in a unit of byte, and the generated error correction codes may only provide an error correction function to the data. The controller of the flash memory provided by the present invention not only has an error correction module having the error correction function, but also has a data disordering module which may convert original sequential written data and the error correction codes into non-sequential written data and the error correction codes for transmitting to the flash memory. By such means, sequence of the stored data may be dispersed. Accordingly, safety of the data transmitted between the controller and the flash memory may be effectively achieved. The accompanying drawings are included to provide a further understanding of the invention, and are incorporated in and constitute a part of this specification. The drawings illustrate embodiments of the invention and, together with the description, serve to explain the principles of the invention.

Figure 1:
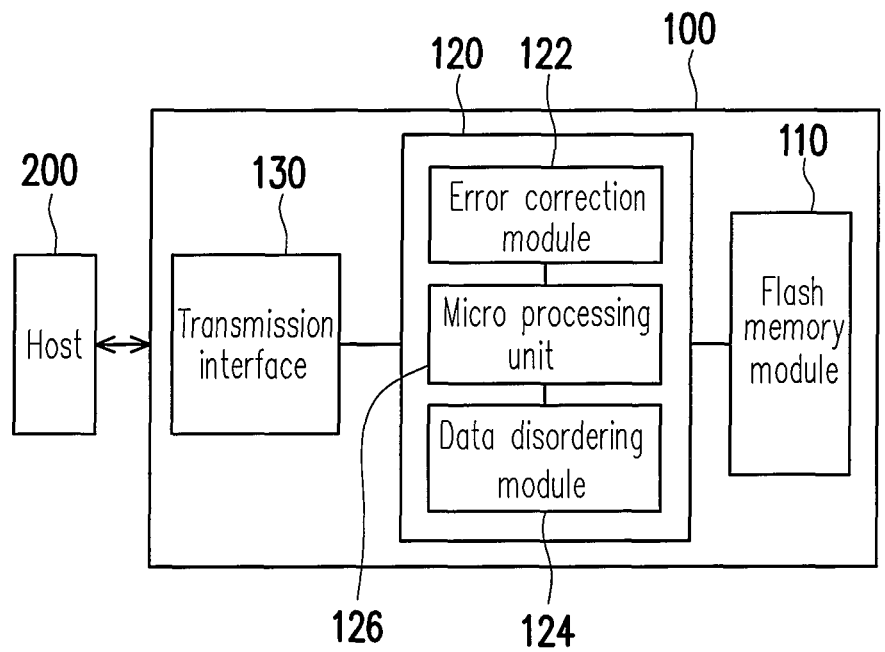
FIG. 1 is block diagram illustrating a flash memory storage apparatus according to an embodiment of the present invention.

FIG. 1 is a schematic block diagram of a flash memory storage apparatus according to an embodiment of the present invention. Referring to FIG. 1, the flash memory storage apparatus 100 includes a flash memory module 110, a controller 120 and a transmission interface 130. The flash memory storage apparatus 100 is generally utilized together with a host 200, so that the host 200 may store data into or read data from the flash memory storage apparatus 100. In the present embodiment, the flash memory storage apparatus 100 is a flash drive. It should be understood that in another embodiment of the present invention, the flash memory storage apparatus 100 may also be a memory card or a solid state disk (SSD).

The flash memory module 110 is coupled to the controller 120 for storing data. In the present embodiment, the flash memory module 110 is a MLC NAND flash memory. However, the present invention is not limited thereto, and in another embodiment, the flash memory module 110 may also be a SLC NAND flash memory.

Generally, the flash memory module 110 is substantially divided into a plurality of physical blocks. For convenience, the physical blocks are referred to as blocks. The blocks are generally divided into a plurality of zones, and the zones may be independently operated for managing the memory, so as to improve a parallel degree of operation and simplify a complexity of management. Generally, the block is a minimum unit that may be erased within the flash memory. Namely, each block contains a minimum number of memory cells that may be erased together. Each block is generally divided into a plurality of pages.

The page is generally the minimum unit that may be programmed. It should be noted that according to different designs of the flash memory, the minimum programmable unit may also be a sector, namely, the page may be divided into a plurality of the sectors, and the sector is the minimum unit that may be programmed. In other words, the page is the minimum unit that data may be written on or read from. Generally, one page is one sector in order to correspond to the size of a sector in a disk driver. However, the page may also include a plurality of the sectors, for example, one page may include 4 sectors. Generally, the block may include arbitrary number of pages, for example, 64 pages, 128 pages, 256 pages etc. Each page generally includes a data area and a spare area. The data area is used for storing data to be written, and the spare area is used for storing related information (such as blocks that the page belongs to, and zones that the page belongs to etc.) of the page to be written on. Therefore, in the present embodiment, the data packet to be written into the flash memory module 130 by the host 200 is a sequence data packet sequentially containing the data area and the spare are. However, it should be noted that in another embodiment of the present invention, the data packet may be the sequence data packet sequentially containing the spare area and the data area.

The controller 120 controls a whole operation (for example, storage, read or erasing etc. of data) of the flash memory storage apparatus 100. The controller 120 includes an error correction module 122, a data disordering module 124 and a micro processing unit 126 used for coordinating operations of the error correction module 122 and the data disordering module 124.

The error correction module 122 is coupled to the micro processing unit 126, and is used for executing an error correction encoding procedure for the data packet to be written into the flash memory module 110, so as to generate the error correction codes. The error correction module 122 is further used for checking and correcting errors and noises probably generated during data transmission when an operation of reading data is performed, according to the generated error correction codes.

To be specific, when the host 200 writes data into the flash memory apparatus 100, the error correction module 122 of the controller 120 performs the error correction encoding for the sequence data packet containing the data to be written (recorded in the data area) and the related data (recorded in the spare area). Next, the sequence data packet and the generated corresponding error correction codes may be combined to form the sequence data codes to be transmitted to the flash memory module 110. In the present embodiment, the sequence data codes sequentially containing the sequence data packet and the corresponding error correction codes are taken as an example. However, in another embodiment of the present invention, the sequence data codes may also sequentially contain the corresponding error correction codes and the sequence data packet. Besides, during the operation of reading data, the error correction module 122 may check the read sequence data packet according to the error correction codes within the sequence data codes, and may correct the errors occurred in the sequence data packet.

The data disordering module 124 is coupled to the micro processing unit 126. In the present embodiment of the present invention, the data disordering module 124 may convert the input sequence data codes into non-sequence data codes, or convert the non-sequence data codes into the sequence data codes. To be specific, the data disordering module 124 may exchange data of at least two bytes within the received data codes. The data disordering module 124 of the present embodiment disorders the data by changing the sequence of the data. However, in another embodiment of the present invention, the data may also be disordered based on an inverting operation (for example "0" is changed to be "1" or "1" is changed to be "0") or an algorithm.

Figure 2:
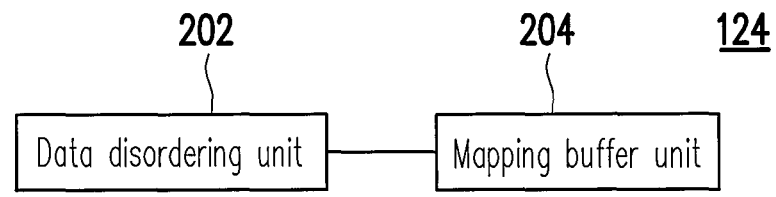
FIG. 2 is a block diagram illustrating a data disordering module of FIG. 1.

For example, as shown in FIG. 2, the data disordering module 124 includes a data disordering unit 202 and a mapping buffer unit 204.

Figure 3:
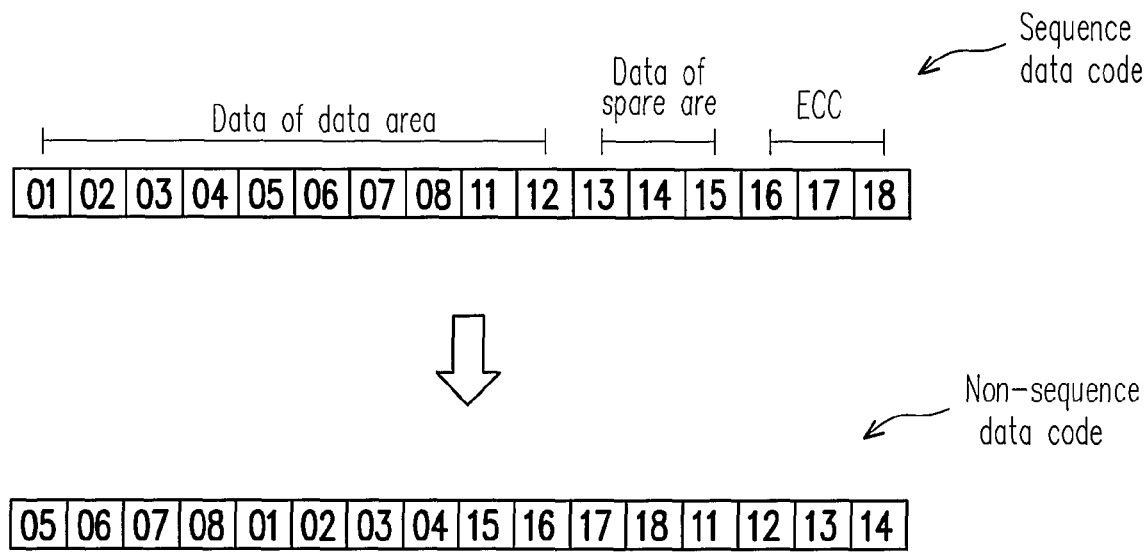
FIG. 3 is a schematic diagram illustrating an example of data codes conversion performed by a data disordering module.

Referring to FIG. 2, in the present embodiment, the data disordering unit 202 is used for dividing the input data codes into a plurality of sub data codes (8 bytes), and exchanging the front 4 bytes and the rear 4 bytes in a unit of every sub data code. As shown in FIG. 3, when the input sequence data codes are data with 16 bytes "01 02 03 04 05 06 07 08 11 12 13 14 15 16 17 18", the data disordering unit 202 may encode it as "05 06 07 08 01 02 03 04 15 16 17 18 11 12 13 14". Conversely, when the input non-sequence data codes are data with 16 bytes "05 06 07 08 01 02 03 04 15 16 17 18 11 12 13 14, the data disordering unit 202 then inversely encode it as "01 02 03 04 05 06 07 08 11 12 13 14 15 16 17 18". However, it should be noted that the above exchanging method is not limited by the present invention, and those skilled in the art should be understood that other exchanging methods or rearrange methods may also be applied according to the aforementioned spirit.

The mapping buffer unit 204 is coupled to the data disordering unit 202 and may transmit the non-sequence data codes generated by the data disordering unit 202 to the flash memory module 110 in a unit of every sub non-sequence data code. Moreover, when the mapping buffer unit 204 receives the non-sequence data codes from the flash memory module 110, in coordination with the data disordering unit 202, the complete sub non-sequence data codes then may be mapped and transmitted to the data disordering unit 202. To be specific, in the present embodiment, the mapping buffer unit 204 has a first in first out (FIFO) register with 8 bytes. When the data disordering unit 202 encodes the input sequence data codes "01 02 03 04 05 06 07 08 11 12 13 14 15 16 17 18" to be "05 06 07 08 01 02 03 04 15 16 17 18 11 12 13 14", the data disordering unit 202 first transmit "05 06 07 08" to the mapping buffer unit 204, and after such data transmission is completed, the data disordering unit 202 then transmits "01 02 03 04" to the mapping buffer unit 204, and so on and vice versa.

Figure 4:
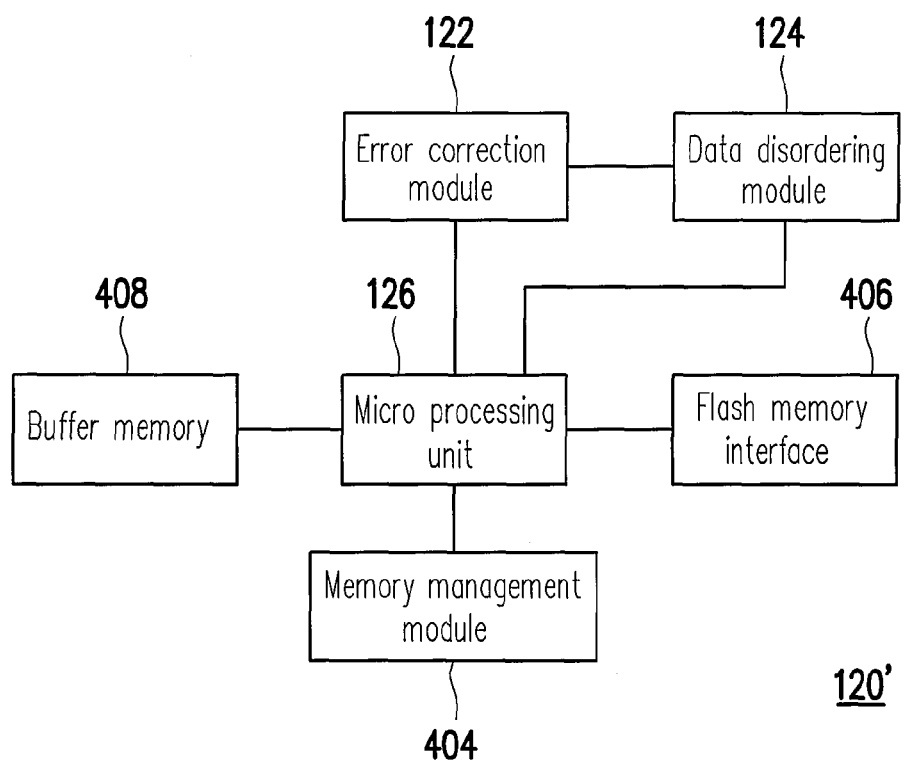
FIG. 4 is a block diagram illustrating a controller according to another embodiment of the present invention.

It should be noted that besides the error correction module 122, the data disordering module 124 and the micro processing unit 126, the controller may further includes a memory management module 404, a flash memory interface 406 and a buffer memory 408 (shown as a controller 120' of FIG. 4).

For example, the memory management module 404 is coupled to the micro processing unit 126. The memory management module 404 is used for managing the flash memory 130, for example, executing a wear leveling method, managing damaged blocks, maintaining a mapping table etc. The flash memory interface 406 is coupled to the micro processing unit 126 and is used for accessing the flash memory module 110. Namely, the data to be written into the flash memory module 110 by the host 200 is transformed into a format that may be accepted by the flash memory module 110 via the flash memory interface 406. The buffer memory 408 is used for temporarily storing system data (for example, a mapping table for mapping logical blocks to physical blocks) or data to be read or written by the host 200. For example, the buffer memory 408 is a static random access memory (SRAM). However, it should be noted that the present invention is not limited thereof, and a dynamic random access memory (DRAM), a magnetoresistive random access memory (MRAM), a phase change random access memory (PRAM) or other suitable memories may also be applied.

Referring to FIG. 1 again, the transmission interface 130 connects the host 200 via a bus 300. In the present embodiment, the transmission interface 130 is a USB interface. However, it should be understood that the present invention is not limited thereof, and the transmission interface 130 may also be a PCI express interface, an IEEE1394 interface, a SATA interface, a MS interface, a MMC interface, a SD interface, a CF interface, an IDE interface or other interfaces suitable for data transmission.

In summary, when data is about to be stored into the flash memory storage apparatus 100 of the present embodiment, the error correction module 122 performs the error correction encoding for the data, and the data disordering module 124 disperses the sequence of the data to be stored, and transmits the data to the flash memory module 110. In other words, according to the present embodiment of the invention, before the aforementioned generated sequence data codes are programmed into the flash memory module 110, the data disordering module 124 of the controller 120 may divide the sequence data codes into a plurality of the sub sequence data codes, and exchange data of the front several bytes with data of the rear several bytes within each of the sub sequence data codes, so as to generate a plurality of the sub non-sequence data codes, wherein number of the bytes may be determined according to a volume of the mapping buffer unit. By such means, the data disordering module 124 converts the original sequence data codes with a specific sequence (i.e. a sequence of user's data, system data and the error correction codes) into the non-sequence data codes with the user's data, the system data and the error correction codes thereof being unidentified (shown as FIG. 3). Next, the non-sequence data codes are then transmitted to the flash memory module 110. Accordingly, components of the data transmitted between the controller 120 and the flash memory module 110 cannot be identified, and therefore safety of the stored data may be enhanced.

Figure 5:
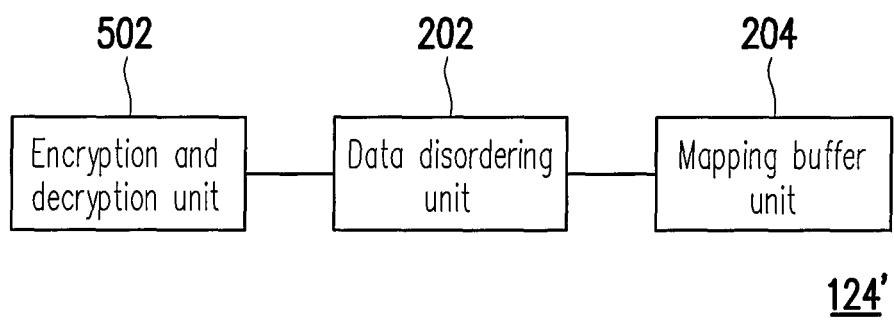
FIG. 5 is a block diagram illustrating a data disordering module according to another embodiment of the present invention.

In another embodiment of the present invention, the data disordering module may further include an encryption/decryption unit 502 (as shown in FIG. 5). The encryption/decryption unit 502 may encrypt the sequence data codes containing the data packet and the error correction codes with a key during a storage operation, and during a reading operation, the encryption/decryption unit 502 may decrypt the read sequence data codes with the key. Therefore, the transmitted data codes may be further protected.

Moreover, to further improve a safety of the data packet, in another embodiment of the present invention, the error correction module 122 may perform the error correction encoding for each byte of the data packet in a non-sequential approach. In detail, when the data packet is about to be transmitted to the error correction module 122 for performing the error correction encoding, each byte of the data packet is transmitted to the error correction module 122 with the non-sequential approach for performing the error correction encoding. Accordingly, before the data disordering module 124 disperses the data packet and the error correction codes, an initial dispersing operation is performed to further disperse the data arrangement sequence of the data codes to be transmitted to the flash memory module 110. In detail, in the present embodiment, the error correction module 122 performs encoding to one byte each time. Therefore, when the data packet is transmitted to the error correction module 122, the micro processing unit 126 then arranges an internal data of the data packet as the user's data with 6 bytes and the system data with 2 bytes. However, it should be noted that the aforementioned data rearrangement is not limited by the present invention, and those skilled in the art should be understood that other rearrange methods may also be applied according to the aforementioned spirit of the present invention.

Figure 6:
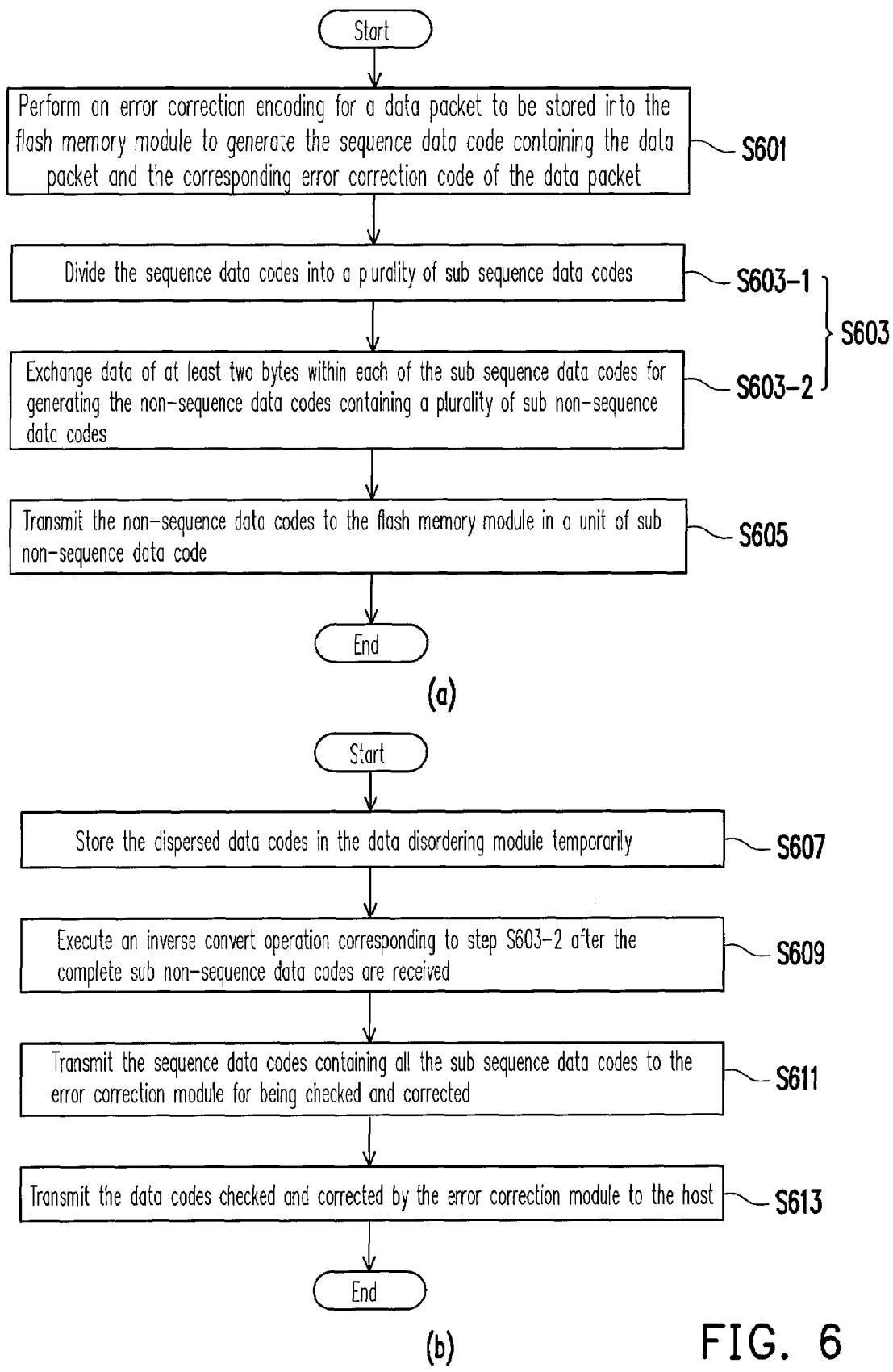
FIG. 6 is a flowchart illustrating a data accessing method according to an embodiment of the present invention.

FIG. 6 is a flowchart illustrating a data accessing method according to an embodiment of the present invention. In which (a) of FIG. 6 illustrates the storage steps, and (b) of FIG. 6 illustrates the reading steps.

Referring the (a) of FIG. 6, when the data is about to be written into the flash memory storage apparatus, in step S601, the data packet to be stored into the flash memory module 110 is first performed with the error correction encoding for generating the sequence data codes containing the data packet and the corresponding error correction codes of the data packet. The aforementioned data packet is a sequence data packet including a data area recording data (user's data) to be written and a spare area recording data (system data) related to the data packet.

Next, in step 603, the sequence data codes are converted into the non-sequence data codes. For example, in the step 603, the sequence data codes are divided into a plurality of the sub sequence data codes (step S603-1), and data of at least two bytes within each of the sub sequence data codes are exchanged for generating the non-sequence data codes containing a plurality of the sub non-sequence data codes (step S603-2). Accordingly, the data of the data area and the spare area and the error correction codes within the data packet are dispersed in the non-sequence data codes. Finally, in step S605, the non-sequence data codes are programmed into the flash memory module 110.

Moreover, when the data stored in the flash memory module 110 via the aforementioned steps is about to be read, the written data has to be restored based on reverse steps via the same modules.

Referring to (b) of FIG. 6, for example, when the data to be read is transmitted from the flash memory module 110 to the controller 120, in step S607, the dispersed data codes are first stored in the data disordering module 124 temporarily, for example, in the mapping buffer unit 204. After the complete sub non-sequence data codes are received, the data disordering module 124 may execute an inverse convert operation (step S609). For example, in the step 609, the data disordering unit 202 may exchange the data of the front 4 bytes with the data of the rear 4 bytes, so as to restore the sub non-sequence data codes to the sub sequence data codes. Next, the sequence data codes containing all the sub sequence data codes are transmitted to the error correction module for being checked and corrected (step S611). Finally, the controller 120 transmits the data codes being checked and corrected by the error correction module to the host 200 (step S613).

In another embodiment of the present invention, the data accessing method may further includes encrypting/decrypting the sequence data codes with a key, or the step of performing the error correction encoding for the data packet includes performing the error correction encoding for each byte of the data packet via a non-sequential approach, so as to enhance the safety of the data codes to be programmed. Moreover, it should be noted that the data disordering module 124 and the error correction module 122 may be implemented by a hardware or a software approach.

In summary, according to the present invention, the controller of the flash memory not only performs the error correction encoding for the data packet in a unit of byte during the operation of storing data, but also exchanges data bytes within the sequence data codes containing the data packet and the error correction codes in a unit of a plurality of bytes, so as to disperse the sequence data codes into the non-sequence data codes for preventing distinguishing of the data area and the spare area of the data packet and the error correction codes. Accordingly, safety of the stored data may be effectively ensured. Moreover, according to the present invention, the sequence data codes may be encrypted, or during the error correction encoding of the data packet, each byte of the data packet is error correction encoded based on the non-sequential approach, so as to enhance the safety of the data codes to be stored.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A storage apparatus, comprising:
a flash memory module, for storing data;
a controller, coupled to the flash memory module, for accessing the flash memory module, and the controller comprising:
a micro processing unit;
an error correction module, coupled to the micro processing unit for performing an error correction encoding for a data packet to be stored into the flash memory module to generate a sequence data code containing the data packet, a corresponding error correction code of the data packet, and performing an error correction for the data packet according to the error correction code, wherein the flash memory module comprises a plurality of pages, and each of the plurality of pages comprises a data area and a spare area, wherein the data packet comprises user data to be stored in the data area and system data to be stored in the spare area; and
a data disordering module, coupled to the micro processing unit for dispersing the user data, the system data and the error correction code in the sequence data code so as to convert the sequence data code into a non-sequence data code, and inversely converting the non-sequence data code into the sequence data code, wherein the data disordering module transmits the non-sequence data code to the flash memory module; and
a transmission interface, coupled to the controller for connecting a host.

2. The storage apparatus as claimed in claim 1, wherein the data disordering module comprises:
a data disordering unit, configured to divide the sequence data code into a plurality of sub sequence data codes, and exchange data of at least two bytes within each of the sub sequence data codes for generating the non-sequence data code containing a plurality of sub non-sequence data codes, and configured to inversely exchange the sub non-sequence data codes for restoring the sub sequence data codes; and
a mapping buffer unit, configured to transmit the non-sequence data code to the flash memory in a unit of each sub non-sequence data code, and configured to transmit the non-sequence data code received from the flash memory module to the data disordering unit in a unit of each sub non-sequence data code.

3. The storage apparatus as claimed in claim 2, wherein the data disordering module further comprises an encryption/decryption unit used for encrypting and decrypting the sequence data code.

4. The storage apparatus as claimed in claim 1, wherein the micro processing unit transmits each byte of the data packet to the error correction module in a non-sequential approach to perform the error correction encoding.

5. The storage apparatus as claimed in claim 1, wherein the flash memory module is a single level cell (SLC) NAND flash memory module or a multi level cell (MLC) NAND flash memory module.

6. The storage apparatus as claimed in claim 1, wherein the transmission interface is a PCI express interface, a USB interface, an IEEE1394 interface, a SATA interface, a MS interface, a MMC interface, a SD interface, a CF interface or an IDE interface.

7. A controller, suitable for a storage apparatus having a flash memory module, and the controller comprising:
a micro processing unit;
an error correction module, coupled to the micro processing unit for performing an error correction encoding for a data packet to be stored into the flash memory module to generate a sequence data code containing the data packet and a corresponding error correction code of the data packet, and performing an error correction for the data packet according to the error correction code, wherein the flash memory module comprises a plurality of pages, and each of the plurality of pages comprises a data area and a spare area, wherein the data packet comprises user data to be stored in the data area and system data to be stored in the spare area; and
a data disordering module, coupled to the micro processing unit, for dispersing the user data, the system data and the error correction code in the sequence data code so as to convert the sequence data code into a non-sequence data code, and inversely converting the non-sequence data code into the sequence data code, wherein the data disordering module transmits the non-sequence data code to the flash memory module.

8. The controller as claimed in the claim 7, wherein the data disordering module comprises:
a data disordering unit, configured to divide the sequence data code into a plurality of sub sequence data codes, and exchange data of at least two bytes within each of the sub sequence data codes for generating the non-sequence data code containing a plurality of sub non-sequence data codes, and configured to inversely exchange the sub non-sequence data codes for restoring the sub sequence data codes; and
a mapping buffer unit, configured to transmit the non-sequence data code to the flash memory in a unit of each sub non-sequence data code, and configured to transmit the non-sequence data code received from the flash memory module to the data disordering unit in a unit of each sub non-sequence data code.

9. The controller as claimed in the claim 8, wherein the data disordering module further comprises an encryption/decryption unit used for encrypting and decrypting the sequence data code.

10. The controller as claimed in the claim 7, wherein the micro processing unit transmits each byte of the data packet to the error correction module in a non-sequential approach to perform the error correction encoding.

11. The controller as claimed in the claim 7, wherein the flash memory module is a single level cell (SLC) NAND flash memory module or a multi level cell (MLC) NAND flash memory module.

12. The controller as claimed in the claim 7, wherein the storage apparatus is a USB flash drive, a flash memory card or a solid-state disk.

* * * * *